(12) United States Patent
Yase et al.

(10) Patent No.: US 10,599,965 B2
(45) Date of Patent: Mar. 24, 2020

(54) RF TAG CIRCUIT

(71) Applicant: OMRON Corporation, Kyoto (JP)

(72) Inventors: Satoshi Yase, Nara (JP); Tetsuya Nosaka, Ibaraki (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/103,945

(22) Filed: Aug. 15, 2018

(65) Prior Publication Data
US 2019/0180158 A1   Jun. 13, 2019

(30) Foreign Application Priority Data

Sep. 14, 2017   (JP) ................................. 2017-177045

(51) Int. Cl.
| | | |
|---|---|---|
| *G06K 19/07* | (2006.01) | |
| *G06K 19/077* | (2006.01) | |
| *H04L 25/02* | (2006.01) | |
| *H03H 7/40* | (2006.01) | |
| *H03H 7/38* | (2006.01) | |

(52) U.S. Cl.
CPC ..... *G06K 19/0715* (2013.01); *G06K 19/0712* (2013.01); *G06K 19/0723* (2013.01); *G06K 19/07756* (2013.01); *H04L 25/0278* (2013.01); *G06K 19/0716* (2013.01); *H03H 7/38* (2013.01); *H03H 7/40* (2013.01)

(58) Field of Classification Search
CPC ............ G06K 19/0712; G06K 19/0723; H04L 25/0278
See application file for complete search history.

(56) References Cited

U.S. PATENT DOCUMENTS

| | | | |
|---|---|---|---|
| 2014/0063666 A1 | 3/2014 | Kallal et al. | |
| 2016/0006369 A1* | 1/2016 | Zoescher | H02M 7/217 455/73 |

(Continued)

FOREIGN PATENT DOCUMENTS

JP   H07111470   4/1995

OTHER PUBLICATIONS

Office Action of Korean Counterpart Application, with English translation thereof, dated Jun. 24, 2019, pp. 1-7.

(Continued)

*Primary Examiner* — Nabil H Syed
(74) *Attorney, Agent, or Firm* — JCIPRNET

(57) ABSTRACT

An RF tag circuit connected to an antenna and a load is provided. The RF tag circuit includes: a rectification circuit rectifying a radio wave received by the antenna and supplying DC power; a matching circuit having a changeable impedance and disposed between the antenna and the rectification circuit; a control part repeatedly controlling activation and stopping of the load; and an adjustment part changing the impedance of the matching circuit in a predetermined direction, storing a first electric power generated by the rectification circuit when a predetermined time has elapsed after the load is activated, and changing the impedance of the matching circuit based on a magnitude relationship between a second electric power generated by the rectification circuit when the predetermined time has elapsed after the load is activated at a timing after the first electric power is generated and the stored first electric power.

15 Claims, 13 Drawing Sheets

(56) References Cited

U.S. PATENT DOCUMENTS

2017/0193256 A1 7/2017 Jung et al.
2017/0345621 A1 11/2017 Cheng

OTHER PUBLICATIONS

Office Action of Taiwan Counterpart Application, with English translation thereof, dated Jun. 21, 2019, pp. 1-10.
"Search Report of Europe Counterpart Application", dated Dec. 17, 2018, p. 1-p. 5.

* cited by examiner

RF TAG CIRCUIT

CROSS-REFERENCE TO RELATED APPLICATION

This application claims the priority benefit of Japan application serial no. 2017-177045, filed on Sep. 14, 2017. The entirety of the above-mentioned patent application is hereby incorporated by reference herein and made a part of this specification.

BACKGROUND

Technical Field

The disclosure relates to an RF tag circuit that is connected to an antenna and a load.

Description of Related Art

In recent years, the development of RF tags has been remarkable, and use of RF tags for driving loads such as a sensor, an LED, an IC, a microcomputer, a communication circuit, and an RF tag circuit as examples using power supplied through received radio waves as an energy source has increased in addition to their original use of object identification. In some cases, the electric power received by RF tags is further increased such that the electric power is stably supplied for operations of such loads. In such an RF tag circuit, there are cases in which a power supply capability for a load decreases due to impedance mismatch between an antenna and an RF tag circuit. The impedance mismatch may occur due to a change in the impedance of the antenna, for example, caused by the attachment or approach of a metal piece, or dielectrics such as water or oil to the antenna. For this reason, technologies for impedance matching between an antenna and an RF tag circuit have been proposed (for example, see Japanese Patent Laid-open No. 7-111470).

There are many cases in which energy supplied through radio waves is insufficient for simultaneously performing driving of loads and other processes. For this reason, in many cases, in an RF tag circuit, a load is activated and driven at a predetermined cycle, and other processes are executed when the load is not driven.

In adjustment of the impedance, searching for an impedance value is performed such that the electric power generated by the RF tag circuit increases while the impedance of the RF tag circuit is changed. When the load is not driven, the voltage is saturated (for example, a state in which the voltage reaches a limit value according to a limiter). Accordingly, although the adjustment of the impedance is performed when the load is not driven, an increase in electric power is not detected, and it is difficult to appropriately adjust the impedance. For this reason, it is desirable to adjust the impedance while the load is driven.

In the search for an impedance value, it is desirable to adjust the impedance in a state in which the electric power generated by the RF tag circuit is stable. For this reason, a load driving period is determined such that a period until the electric power generated by the RF tag circuit is stabilized is secured. As a result, even when a load that can be driven in a time shorter than a period until the electric power generated by the RF tag circuit is stabilized is employed, it is difficult to shorten the load driving period.

SUMMARY

An embodiment of the disclosure provides an RF tag circuit connected to an antenna and a load as an example. The RF tag circuit includes a rectification circuit, a matching circuit, a control part, and an adjustment part. The rectification circuit rectifies a radio wave received by the antenna and supplies DC power. The matching circuit, of which an impedance is changeable, is disposed between the antenna and the rectification circuit. The control part repeatedly controls activation and stopping of the load. The adjustment part changes the impedance of the matching circuit in a predetermined direction and stores a first electric power generated by the rectification circuit when a predetermined time has elapsed after the load is activated and changes the impedance of the matching circuit based on a magnitude relationship between a second electric power generated by the rectification circuit when the predetermined time has elapsed after the load is activated at a timing after a time point at which the first electric power is generated and the stored first electric power.

DESCRIPTION OF THE EMBODIMENTS

Figure 1:
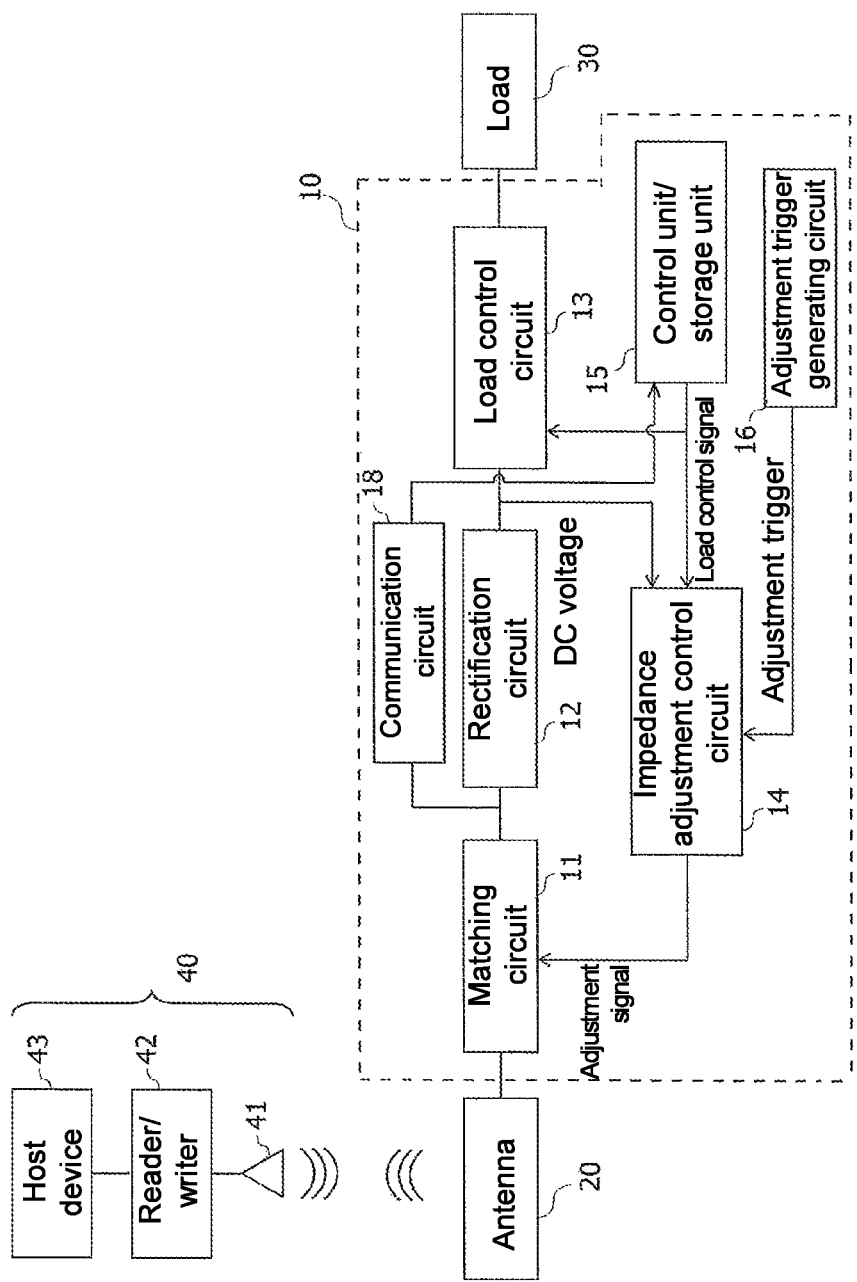
FIG. 1 is a diagram illustrating one example of a configuration and a usage form of an RF tag circuit according to an embodiment.

An embodiment of the disclosure provides an RF tag circuit capable of executing impedance adjustment even in a state in which the electric power generated by an RF tag circuit is unstable.

In the configuration described above, the load is a device that is driven using electric power supplied through received radio waves as an energy source. The load is, for example, a sensor, an LED, an IC, a microcomputer, a communication circuit, an RF tag circuit, or the like. The matching circuit includes a variable impedance device. The variable impedance device, for example, may be a circuit acquired by combining a plurality of capacitors or an analog control device such as a varactor diode. In the configuration described above, when a predetermined time, which is equal to or less than a driving time of the load, has elapsed after the load is activated, the impedance of the matching circuit is changed in a predetermined direction, and first electric power generated by the rectification circuit is stored. The RF tag circuit changes the impedance of the matching circuit based on a magnitude relation between second electric power generated by the rectification circuit when a predetermined time has elapsed after the load is activated and the stored first electric power at a timing after a time point at which the first electric power is generated. For example, when the predetermined direction is a direction in which the impedance increases, when there is impedance matching between the antenna and the RF tag circuit, the second electric power is equal to or less than the first electric power. For this reason, by comparing the second electric power with the first electric power, the RF tag circuit can determine whether or not there is impedance matching and further increase the impedance of the matching circuit when there is impedance mismatch. When the direction in which the impedance increases is employed as the predetermined direction, a search algorithm for an impedance value for which the antenna and the RF tag circuit match each other is a linear search of monotonously increasing the impedance. However, the search algorithm for an impedance value is not limited to the linear search using a monotonous increase. As the search algorithm for an impedance value, an arbitrary algorithm such as a linear search using a monotonous decrease, a binary search, or a tree search may be employed. In addition, since a voltage when a predetermined time elapses from the activation of the load is used for the comparison, even in a state in which electric power generated by the rectification circuit is unstable due to a voltage drop caused by the activation of the load, the RF tag circuit can detect a change in the electric power. Since a change in the electric power can be detected even in a state in which the electric power is unstable, in the configuration described above, the predetermined time may be less than a time that is represented by a time constant of the load.

In the configuration described above, an instruction circuit that transmits an adjustment instruction instructing start of impedance adjustment to the adjustment part when the impedance between the RF tag circuit and the antenna is mismatched may be further included. The adjustment part may start a process when receiving the adjustment instruction from the instruction circuit. By employing such a configuration, the RF tag circuit can execute adjustment of the impedance when the impedance between the RF tag circuit and the antenna is mismatched.

In the configuration described above, the case in which the impedance between the RF tag circuit and the antenna is mismatched may include a case in which a voltage generated by the rectification circuit is less than a predetermined threshold due to a voltage drop accompanying the activation of the load. The predetermined threshold is, for example, determined based on a voltage enabling the load to be stably driven. By employing such a configuration, when electric power supplied from the rectification circuit is insufficient for stable driving of the load, the RF tag circuit can execute adjustment of the impedance.

In the configuration described above, the case in which the impedance between the RF tag circuit and the antenna is mismatched may include a case in which an execution result of a command for the load, which is received from a device (for example, a reader/writer device or a communication interface) using the load through wireless communication via the antenna, is an error. The device using the load through wireless communication via the antenna is, for example, a reader/writer device acquired by connecting an antenna-attached reader/writer to a host device such as a computer. When the execution result of the command for the load is an error, the electric power generated by the rectification circuit decreases due to an influence of impedance mismatch between the antenna and the RF tag circuit, and, as a result, a case in which the load does not stably operate may be assumed. For this reason, by employing such a configuration, the RF tag circuit can execute adjustment of the impedance when the load does not stably operate.

In the configuration described above, the case in which the impedance between the RF tag circuit and the antenna is mismatched may include a case in which an instruction for impedance adjustment is received from a device using the load through wireless communication via the antenna. For example, when receiving an error from a response from the load, or when transmitting a command to the load or the like, the device using the load may transmit an instruction for the impedance adjustment. For this reason, by employing such a configuration, the RF tag circuit can execute the adjustment of the impedance in accordance with the instruction from the device using the load. In addition, in the configuration described above, the load may be activated at a predetermined time cycle. Here, it is not necessary for the predetermined cycle to strictly match a time taken for one cycle in each cycle. That is, time taken for one cycle may vary somewhat.

This RF tag circuit is capable of executing adjustment of the impedance even in a state in which a voltage is unstable.

Hereinafter, embodiments will be described with reference to the drawings. The configurations of the embodiments illustrated below are examples, and the disclosed technologies are not limited to the configurations of the embodiments.

<First Embodiment>

FIG. 1 is a diagram illustrating one example of a configuration and a use form of an RF tag circuit 10 according to an embodiment. The RF tag circuit 10 is connected to an antenna 20 and a load 30. The RF tag circuit 10 is a circuit that constitutes a system in which a reader/writer device 40 can wirelessly use the load 30. The load 30 is a device that is driven using electric power supplied through received radio waves as an energy source. The load 30 is, for example, a sensor, an LED, an IC, a microcomputer, or the like. The RF tag circuit 10 is a circuit that drives the load 30 using radio waves received from the reader/writer device 40 as an energy source. The RF tag circuit 10 activates and drives the load 30 at a predetermined cycle and executes other processes such as communication and the like in a period in which the load is not driven. The RF tag circuit 10 may be regarded also as a wireless power supply circuit or a wireless power supply device. In addition, the load 30 connected to the RF tag circuit 10 may be regarded as a wireless sensor. The RF tag circuit 10 is, for example, realized by any one of an IC chip, a circuit combining discrete components, and a circuit combining an IC chip and discrete components. In addition, the reader/writer device 40 is, for example, a device in which a reader/writer 42 to which the antenna 41 is attached is connected to a host device 43 such as a computer. The load 30 is one example of "load." The reader/writer device 40 is one example of "a device using the load described above through wireless communication executed through the antenna."

The RF tag circuit 10 is, for example, a circuit that is connected to the antenna 20 receiving radio waves from the reader/writer device 40 and the load 30 used by the reader/writer device 40. The RF tag circuit 10 includes a matching circuit 11, a rectification circuit 12, a load control circuit 13, an impedance adjustment control circuit 14, a control part/storage part 15, an adjustment trigger generating circuit 16, and a communication circuit 18.

Figure 2:
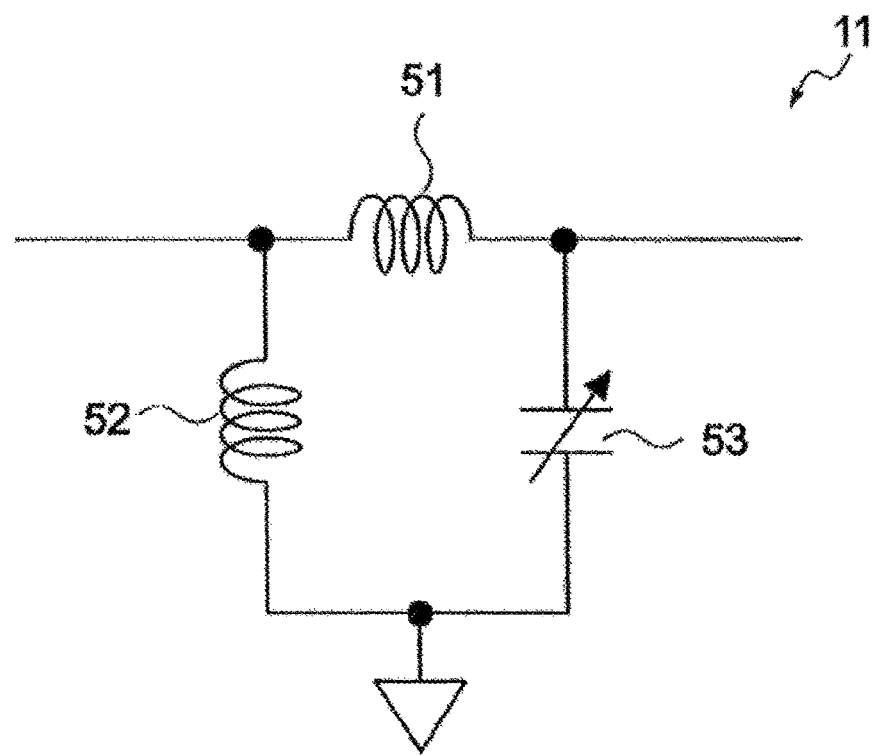
FIG. 2 is a diagram illustrating one example of the configuration of a matching circuit.
Figure 3:
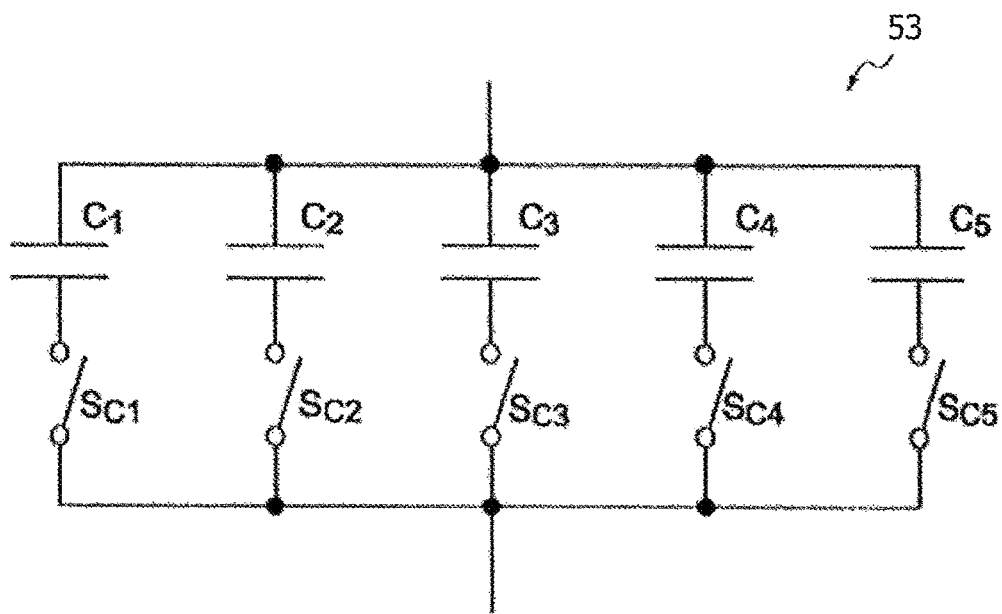
FIG. 3 is a diagram illustrating one example of the configuration of a variable capacitor of a matching circuit.

The matching circuit 11 is a circuit that is used for impedance matching between the antenna 20 and a circuit disposed inside the RF tag circuit 10. The matching circuit 11 is disposed between the antenna 20 and the rectification circuit 12. A specific circuit configuration of the matching circuit 11 is not particularly limited. The circuit configuration of the matching circuit 11, for example, as illustrated in FIG. 2, may be a circuit acquired by combining two inductors 51 and 52 and a variable-capacitance capacitor 53 of which a capacitance can be changed in accordance with an adjustment signal supplied from the impedance adjustment control circuit 14. As the variable-capacitance capacitor 53 of which a capacitance can be changed in accordance with an adjustment signal received from the impedance adjustment control circuit 14, for example, a circuit acquired by combining capacitors $C_1$ to $C_5$ having mutually different capacitance values and switches $S_{C1}$ to $S_{C5}$ as illustrated in FIG. 3 may be used. In addition, the matching circuit 11 may be an analog control device such as a varactor diode. In the RF tag circuit 10, when a metal piece, or dielectrics such as water,or oil is attached to or approaches the antenna 20, the impedance of the antenna 20 may change. When impedance mismatch between the antenna 20 and the circuit disposed inside the RF tag circuit 10 increases in accordance with a change in the impedance of the antenna 20, energy transmission efficiency from the antenna 20 to the circuit disposed inside the RF tag circuit 10 decreases. Thus, by achieving impedance matching between the antenna 20 and the circuit disposed inside the RF tag circuit 10 using the matching circuit 11, a decrease in the energy transmission efficiency from the antenna 20 to the circuit disposed inside the RF tag circuit 10 is suppressed. The matching circuit 11 is one example of "matching circuit."

Figure 4:
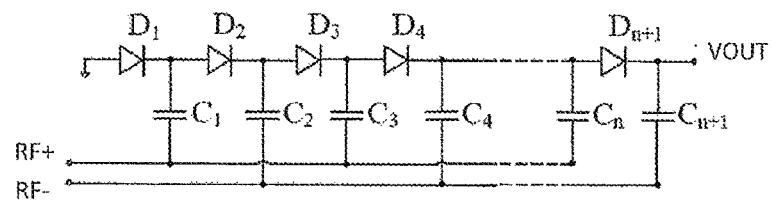
FIG. 4 is a diagram illustrating one example of the configuration of a rectification circuit.

The rectification circuit 12 is a circuit that rectifies AC power output by the antenna 20 that has received radio waves and supplies DC power to the load 30 and each unit (the load control circuit 13 and the impedance adjustment control circuit 14) disposed inside the RF tag circuit 10. FIG. 4 is a diagram illustrating one example of the configuration of the rectification circuit 12. The rectification circuit 12, as illustrated in FIG. 4 as an example, may be a circuit acquired by connecting voltage doubler rectification circuits each configured of two diodes D ($D_1$ and $D_2$ or the like) and two capacitors ($C_1$ and $C_2$ or the like) in multiple stages. The rectification circuit 12 may generate a DC signal of a different system used for the adjustment of the impedance in addition to a power supply voltage VOUT used for driving the load 30. The rectification circuit 12 is one example of "rectification circuit."

The communication circuit 18 is a circuit used for performing wireless communication with the reader/writer device 40 through the antenna 20. The communication circuit 18 includes a demodulation circuit that extracts information such as a command from a radio wave received from the reader/writer device 40 and a modulation circuit that modulates information to be transmitted to the reader/writer device 40 using a radio wave. The communication circuit 18, for example, receives a command transmitted from the reader/writer device 40 through wireless communication and transmits information such as an execution result of a command to the reader/writer device 40 through wireless communication.

Figure 5:
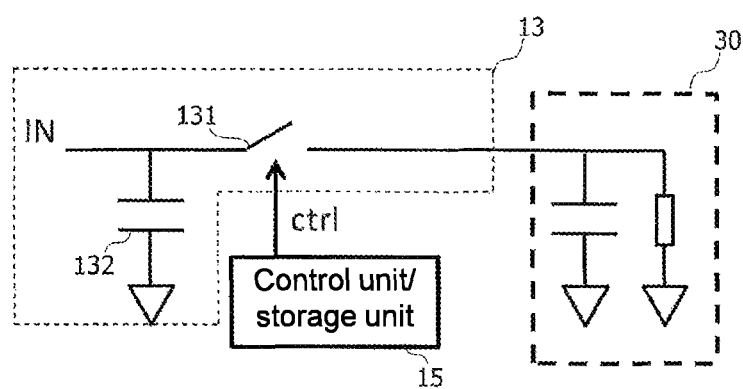
FIG. 5 is a diagram illustrating one example of the configuration of a load control circuit.

The load control circuit 13 is a circuit that activates the load 30 in accordance with a signal received from the control part/storage part 15. FIG. 5 is a diagram illustrating one example of the configuration of the load control circuit 13. As the load control circuit 13, as illustrated in FIG. 5 as an example, a circuit including a switch 131 performing switching between on/off of supply of power to the load 30 and a capacitor 132 may be used. The capacitor 132, for example, stores DC power supplied from the rectification circuit 12. The capacitor 132, for example, may store excess power not used for driving the load 30 in the DC power supplied from the rectification circuit 12. The excess power is, for example, power supplied through a radio wave received by the antenna 20 in a period other than a period for driving the load 30. The power stored in the capacitor 132 is supplied to the load 30. By selecting the capacitor 132 of which a capacitance is relatively large (for example, a capacitance larger than a reciprocal of a resistance component of the load 30 (having a large time constant (in order of seconds))), a drop in the voltage supplied to the load 30 can be suppressed. By selecting such a capacitor 132, even when instantaneous power cutoff or the like occurs due to degradation of the status of reception from the reader/writer device 40, the load 30 can be operated more stably. The switch 131 is turned on while the load control circuit 13 receives a load control signal ctrl from the control part/storage part 15. When the switch 131 becomes on, DC power supplied from the rectification circuit 12 is supplied to the load 30, and the load 30 is activated. For this reason, while the load control circuit 13 receives the load control signal, the load 30 continues to be driven.

The control part/storage part 15 transmits a load control signal causing the switch 131 of the load control circuit 13 to be on at a predetermined cycle. The load control signal is transmitted also to the impedance adjustment control circuit. The control part/storage part 15, for example, transmits a load control signal to the load control circuit 13 in response to a command (a clock signal or the like) input from the outside at the predetermined time cycle, thereby turning on the switch 131 of the load control circuit 13. As a result, the load 30 is activated at the predetermined cycle. The control part/storage part 15 is one example of "control part."

The control part/storage part 15 is, for example, an element acquired by combining a processor and a storage part. The processor is not limited to a single processor and may have a multi-processor configuration. In addition, a single processor connected to a single socket may have a multi-core configuration. At least a part of the process executed by the processor, for example, may be performed by a dedicated processor such as a digital signal processor (DSP), a graphics processing unit (GPU), a numerical operation processor, a vector processor, or an image processing processor. In addition, at least a part of the process executed by the processor may be executed by an integrated circuit (IC) or any other digital circuit. An analog circuit may be included in at least a part of the processor. The integrated circuit includes a large scale integrated circuit (LSI), an application specific integrated circuit (ASIC), and a programmable logic device (PLD). The PLD, for example, includes a field-programmable gate array (FPGA). The processor may be a combination of a processor and an integrated circuit. The combination is, for example, referred to as a micro controller unit (MCU), a system-on-chip (SoC), a system LSI, a chip set, or the like. The storage part is a storage medium for which data can be read and written by the processor. The storage part is, for example, a storage medium that is directly accessed from the processor. The storage part includes, for example, a random access memory (RAM) and a read only memory (ROM).

The adjustment trigger generating circuit 16 transmits an adjustment trigger instructing to start adjustment of the impedance to the impedance adjustment control circuit 14. The adjustment trigger generating circuit 16, for example, transmits the adjustment trigger when the power supply voltage input from the rectification circuit 12 to the impedance adjustment control circuit 14 is below a predetermined threshold. The adjustment trigger generating circuit 16 may, for example, transmit the adjustment trigger when an external adjustment trigger input from an external circuit is input. The adjustment trigger generating circuit 16 is one example of an "instruction circuit." The adjustment trigger is one example of an "adjustment instruction."

Figure 6:
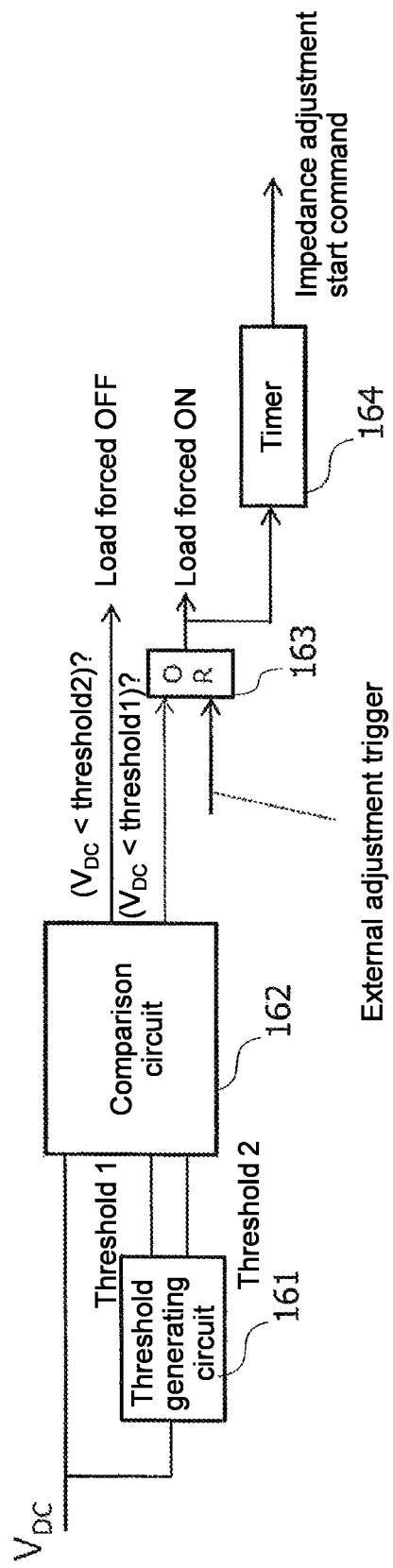
FIG. 6 is a diagram illustrating one example of the configuration of an adjustment trigger generating circuit.

FIG. 6 is a diagram illustrating one example of the configuration of the adjustment trigger generating circuit 16. While an adjustment trigger, as will be described later, is generated by being triggered by various events, the configuration of the adjustment trigger generating circuit 16 that generates an adjustment trigger based on the power supply voltage ($V_{DC}$) supplied from the rectification circuit 12 will be illustrated as an example in FIG. 6. When the adjustment trigger generating circuit 16 exemplified in FIG. 6 is employed in the RF tag circuit 10, a wiring that supplies the power supply voltage from the rectification circuit 12 to the adjustment trigger generating circuit 16 is added in FIG. 1. The adjustment trigger generating circuit 16, for example, includes a threshold generating circuit 161, a comparison circuit 162, an OR element 163, and a timer 164. The threshold generating circuit 161 is a circuit that generates two kinds of threshold including a threshold 1 and a threshold 2. The threshold 1 is, for example, a value representing a voltage that is a reference value from which an impedance adjustment is started. The threshold 1 is determined, for example, by taking a safety coefficient into account with respect to a lower limit value of a voltage enabling the load 30 to stably operate. The threshold 2, for example, represents a lower limit of a voltage enabling the load 30 to stably operate. The threshold 1 is larger than the threshold 2, and the threshold 2 is higher than the lower limit of the voltage value at which the load 30 can be driven. The threshold generating circuit 161, for example, may determine the threshold 1 based on a power supply voltage that is input from the rectification circuit 12. In addition, the threshold generating circuit 161 may store the threshold 2 in a memory in advance. The comparison circuit 162 compares the threshold 1 and the threshold 2 input from the threshold generating circuit 161 with the power supply voltage input from the rectification circuit 12. When the power supply voltage is lower than the threshold 2, a stable operation of the load 30 cannot be expected. For this reason, the adjustment trigger generating circuit 16 transmits a load forced OFF signal to the control part/storage part 15. The load forced OFF signal is an instruction for turning off the load 30 regardless of the predetermined cycle at which the load 30 is activated. When the power supply voltage is larger than the threshold 2 and smaller than the threshold 1, the adjustment trigger generating circuit 16 transmits a load forced ON signal to the control part/storage part 15 and starts counting using the timer 164. The load forced ON signal is an instruction for continuously driving the load 30 regardless of the predetermined cycle at which the load 30 is activated. A voltage stabilization period in which the power supply voltage supplied to the load 30 is considered to be stabilized is stored in the timer 164, and the adjustment trigger generating circuit 16 transmits an adjustment trigger of the control part/storage part 15 after the voltage stabilization period has elapsed after the start of counting using the timer 164. As the voltage stabilization period in which the power supply voltage is considered to be stabilized, for example, there is a period of two to four times the time constant of the load 30.

The adjustment trigger generating circuit 16, for example, may transmit an adjustment trigger based on a comparison result with the thresholds without using an external adjustment trigger. In such a case, the OR element 163 may be omitted from the adjustment trigger generating circuit 16. In addition, the adjustment trigger generating circuit 16, for example, may transmit an adjustment trigger when an external adjustment trigger is input without using the thresholds. In such a case, the threshold generating circuit 161 and the comparison circuit 162 may be omitted from the adjustment trigger generating circuit 16.

The adjustment trigger generating circuit 16 exemplified in FIG. 6 transmits an adjustment trigger based on a comparison result of the thresholds generated by the threshold generating circuit 161 with the power supply voltage and an input of an external adjustment trigger. However, triggers for which the adjustment trigger generating circuit 16 transmits an adjustment trigger are not limited thereto. The adjustment trigger generating circuit 16, for example, may monitor a power supply voltage generated by the rectification circuit 12 and transmit an adjustment trigger based on a result of the monitoring of the power supply voltage. The monitoring of the power supply voltage includes, for example, detection of rising of the power supply, detection of battery connection, release of a limiter, and the comparison with thresholds described with reference to FIG. 6. The detection of the rising of the power supply includes, for example, detection of power-on-reset (POR), detection of start of power supply from an external power source connected to the RF tag circuit 10, and detection of a transition of a storage part of the control part/storage part 15 to a memory read enable state according to supply of the power supply voltage.

In addition, the adjustment trigger generating circuit 16 may include an internal timer and transmit an adjustment trigger every time when the elapse of a predetermined time is counted by the internal timer (that is, regularly). In such a case, the threshold generating circuit 161, the comparison circuit 162, the OR element 163, and the timer 164 may be omitted from the adjustment trigger generating circuit 16.

In addition, in the adjustment trigger generation circuit 16, the RF tag circuit 10 may include an external input terminal, and transmit an adjustment trigger as triggered by an interrupt signal input from the external interface. The external interface is, for example, a general purpose input output (GPIO) terminal. Examples of the interrupt input from the external interface includes an interrupt input from a micro control unit (MCU) connected to the external interface and an interrupt input from an external switch connected to the external interface.

In addition, the adjustment trigger generating circuit 16, for example, may transmit an adjustment trigger in accordance with a command input through a wireless communication counterpart device exemplified as the reader/writer device 40 or a communication interface such as s serial peripheral interface (SPI) or an inter-integrated circuit (I2C). For example, when a continuous wave (CW) is received from the reader/writer device 40, the adjustment trigger generating circuit 16 may transmit an adjustment trigger. In addition, when an execution error of a received command is detected, the adjustment trigger generating circuit 16 may transmit an adjustment trigger. The execution error represents, for example, a case in which the load 30 cannot be activated even when a command for activating the load 30 is received. In addition, when receiving a command, the adjustment trigger generating circuit 16 may transmit an adjustment trigger before or after the execution of the command. Furthermore, the adjustment trigger generating circuit 16 may transmit an adjustment trigger when receiving a command instructing the execution of impedance adjustment. In addition, the adjustment trigger generating circuit 16 may transmit an adjustment trigger when receiving a specific command. The specific command is, for example, a command instructing to activate the load 30.

In addition, the adjustment trigger generating circuit 16, for example, may transmit an adjustment trigger with being triggered by detection of a specific operation. The specific operation, for example, may be a transition between a stopped state and a driven state of the load 30. The specific operation, for example, may be an operation of the GPIO switched between a valid state and an invalid state. The specific operation, for example, may be a transition between a master and a slave as a role in the SPI or the I2C. The specific operation, for example, may be a write process for a nonvolatile memory. The specific operation, for example, may be detection of an error in the operation described above.

Figure 7:
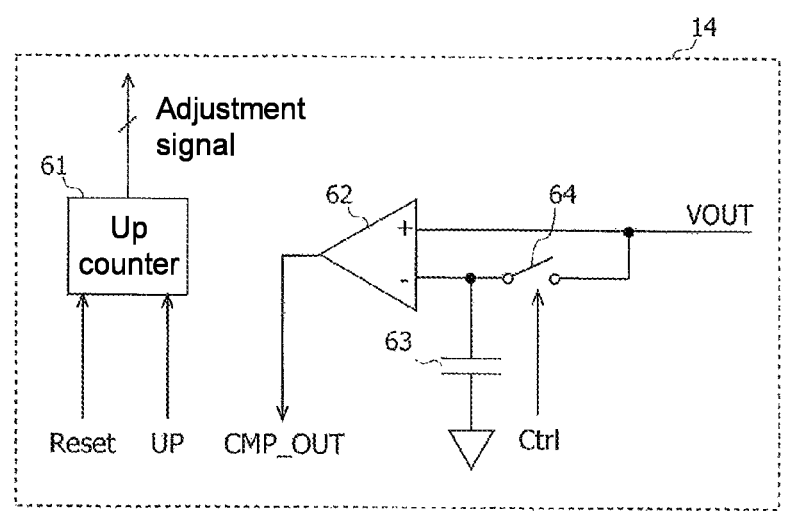
FIG. 7 is a diagram illustrating one example of the configuration of an impedance adjustment control circuit.

The impedance adjustment control circuit 14 is a circuit that outputs an adjustment signal designating the impedance of the matching circuit 11 (in this embodiment, an adjustment signal designating the capacitance of the variable-capacitance capacitor 53 (FIG. 2)). In the RF tag circuit 10 according to this embodiment, for example, the impedance adjustment control circuit 14 having the configuration illustrated in FIG. 7 is used.

While the overall operation of the impedance adjustment control circuit 14 will be described later, an up counter 61 is a counter that clears the counter value to "0" when a reset pulse is input and counts up when an up pulse is input. The counter value of the up counter 61 is used as an adjustment signal designating the impedance of the matching circuit 11 (the capacitance of the variable-capacitance capacitor 53 (FIG. 2)).

Figure 8:
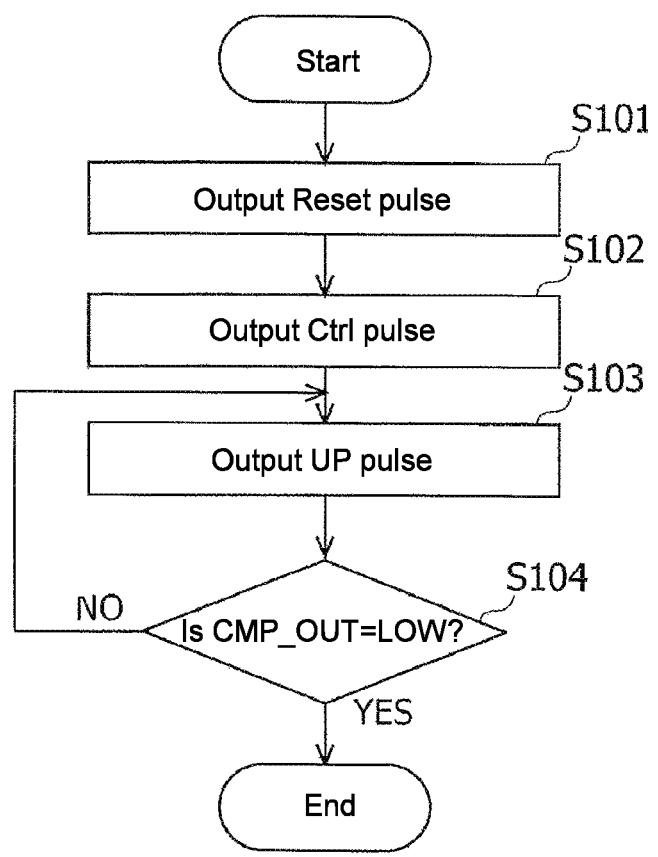
FIG. 8 is a diagram illustrating one example of an impedance adjustment ow using an impedance adjustment control circuit.

A comparator 62 is a circuit that outputs a result of comparison between the power supply voltage (the output voltage of the rectification circuit 12) VOUT and the voltage of a capacitor 63. The output of the comparator 62 is input to the control part/storage part 15 through a CMP_OUT signal line. A switch 64 is a switch that is controlled to be on/off by the control part/storage part 15 through the Ctrl signal line. A Ctrl signal is input, for example, when a load control signal input to the impedance adjustment control circuit 14 becomes off FIG. 8 is a diagram illustrating one example of a control flow of the control part/storage part 15 controlling the impedance adjustment control circuit 14. The control flow illustrated in FIG. 7, for example, is started in accordance with an input of an adjustment trigger from the adjustment trigger generating circuit 16 to the control part/storage part 15. Hereinafter, one example of the control flow of the control part/storage part 15 controlling the impedance adjustment control circuit 14 will be described with reference to FIG. 7.

The control part/storage part 15 to which an adjustment trigger has been input, first, outputs a reset pulse (Step S101). Accordingly, the count value of the up counter 61 disposed inside the impedance adjustment control circuit 14 (see FIG. 7) is reset to "0," and the capacitance of the variable-capacitance capacitor 53 (FIG. 2) disposed inside the matching circuit 11 is adjusted to a lowest capacitance $C_0$.

Next, the control part/storage part 15 outputs a Ctrl pulse (Step S102). That is, the control part/storage part 15 causes the voltage of the capacitor 63 (an input voltage input to a "−" terminal of the comparator 62) to coincide with the power supply voltage VOUT at that time point by turning on the switch 64 and then holds the voltage of the capacitor 63 by turning off the switch 64.

Thereafter, the control part/storage part 15 outputs an up pulse (Step S103) and then determines whether or not the output CMP_OUT of the comparator 62 is low (Step S104).

When the up pulse is input, the count value of the up counter 61 is counted up, and accordingly, the capacitance of the variable-capacitance capacitor 53 disposed inside the matching circuit 11 increases. When the impedance of the matching circuit 11 after increasing the capacitance of the variable-capacitance capacitor 53 is not an appropriate value, and the impedance of the matching circuit 11 is close to the appropriate value, the power supply voltage increases. When the impedance of the matching circuit 11 after increasing the capacitance of the variable-capacitance capacitor 53 is the appropriate value, the voltage supply voltage hardly changes. In addition, when the impedance after increasing the capacitance of the variable-capacitance capacitor 53 does not become the appropriate value, and the impedance further deviates from the appropriate value, the power supply voltage also hardly changes. Accordingly, when the impedance becomes the appropriate value or the impedance further deviates from the appropriate value, the output CMP_OUT becomes low. For this reason, when the output CMP_OUT is low, since the impedance has the appropriate value, or in order to suppress the impedance from further deviating from the appropriate value, the adjustment of the impedance of the matching circuit 11 is completed. On the other hand, when the impedance of the matching circuit 11 does not have the appropriate value, and the impedance of the matching circuit 11 is close to the appropriate value, the output CMP_OUT becomes high. For this reason, when the output CMP_OUT is high, the adjustment of the impedance of the matching circuit is not completed, and the adjustment of the impedance is continued to be executed.

For this reason, when the output CMP_OUT of the comparator 62 is high (Step S104: No), the control part/storage part 15 restarts the process of Step S103 and subsequent steps. Then, when the output CMP_OUT of the comparator 62 becomes low (Step S104: Yes), the control part/storage part 15 ends this impedance adjusting process (the process illustrated in FIG. 8). The impedance adjustment control circuit 14 is one example of "adjustment part."

Figure 9:
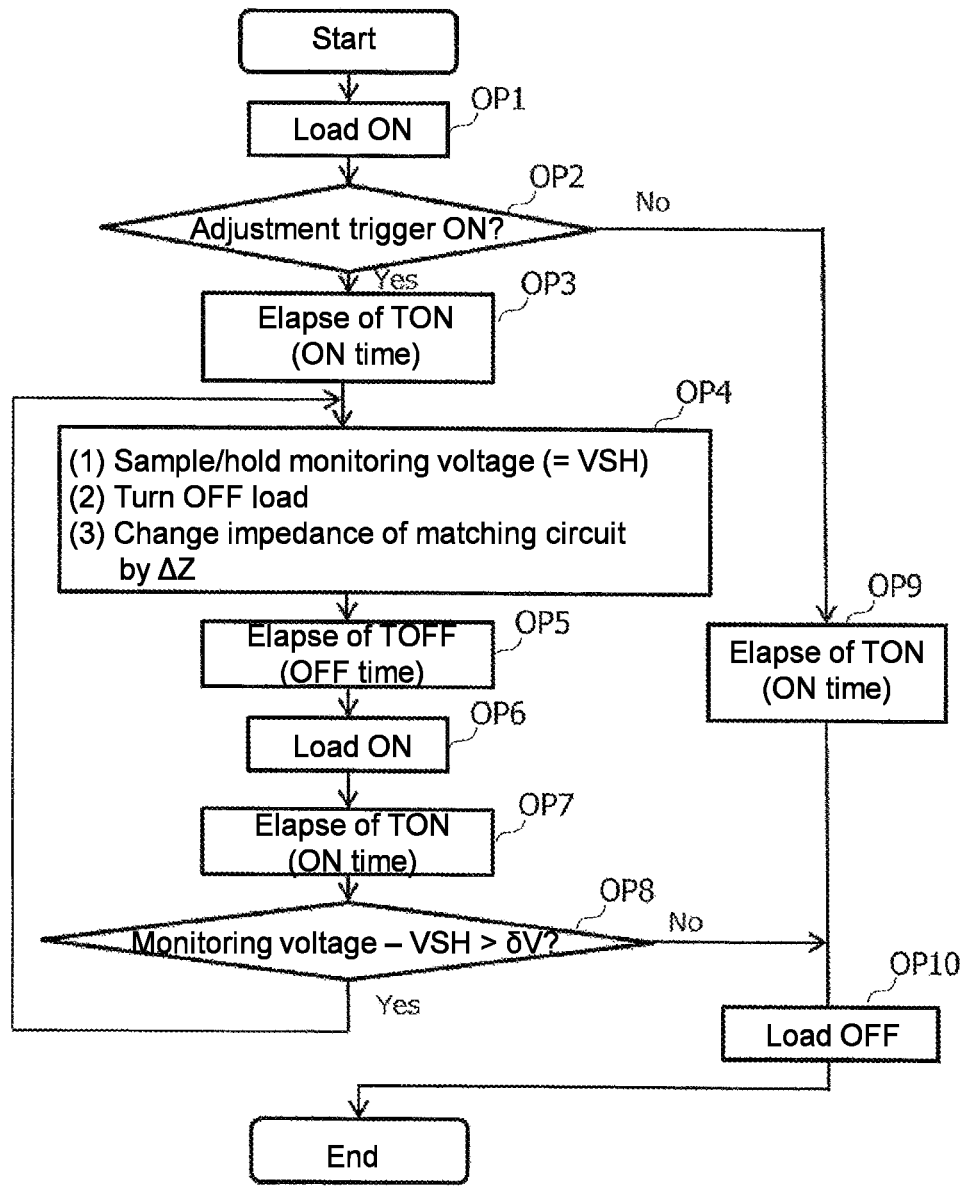
FIG. 9 is a diagram illustrating one example of a processing flow according to an embodiment.

FIG. 9 is a diagram illustrating one example of a processing flow according to the embodiment. Hereinafter, one example of a processing flow according to the embodiment will be described with reference to FIG. 9.

In OP 1, the load control circuit 13 activates the load 30. When an adjustment trigger is input from the adjustment trigger generating circuit 16 (Yes in OP2), the process proceeds to OP3. When an adjustment trigger is not input from the adjustment trigger generating circuit 16 (No in OP2), the process proceeds to OP9.

In OP3, the impedance adjustment control circuit 14 waits for the elapse of a driving time (denoted by TON in the drawing) of the load 30. In OP4, the following processes of (1) to (3) are executed. (1) The impedance adjustment control circuit 14 samples and holds (S/H) a power supply voltage (represented as a monitoring voltage in the drawing) supplied from the rectification circuit 12. (2) The control part/storage part 15 stops the operation of the load 30 by stopping the transmission of the load control signal to the load control circuit 13. (3) The impedance adjustment control circuit 14 changes the impedance of the matching circuit 11 by ΔZ. In OP4, the processing sequences order of (1) to (3) may be interchanged. The process of OP4 is, for example, the process of S102 and S103 illustrated in FIG. 8. The voltage sampled and held in (1) of OP4 is one example of "second electric power."

In OP5, when a stop period (denoted as TOFF in the drawing) of the load 30 stopped in OP4 elapses, the process proceeds to OP6. In OP6, the control part/storage part 15 activates the load 30 by transmitting a load control signal to the load control circuit 13.

Since the process of OP7 is similar to that of OP3, and thus, description thereof will be omitted. In OP8, the impedance adjustment control circuit 14 determines whether or not a difference between the voltage that is S/H in OP4 and the power supply voltage supplied from the rectification circuit 12 at a time point of OP8 is less than δV. Here, δV is a value that is set in accordance with the resolution of the comparator 141 of the impedance adjustment control circuit 14. In addition, δV may be a predetermined threshold. When the difference is larger than δV (Yes in OP8), the process proceeds to OP4. When the difference is equal to or less than δV (No in OP8), the process proceeds to OP10. The process of OP8 is, for example, the process represented in S104 illustrated in FIG. 8. The power supply voltage supplied from the rectification circuit 12 at a time point of OP8 is one example of "first electric power."

In OP9, a load control signal is transmitted from the control part/storage part 15 to the load control circuit 13, whereby the load 30 is driven during the driving time. In OP10, the load control signal supplied from the control part/storage part 15 is stopped, whereby the operation of the load 30 is stopped.

Figure 10:
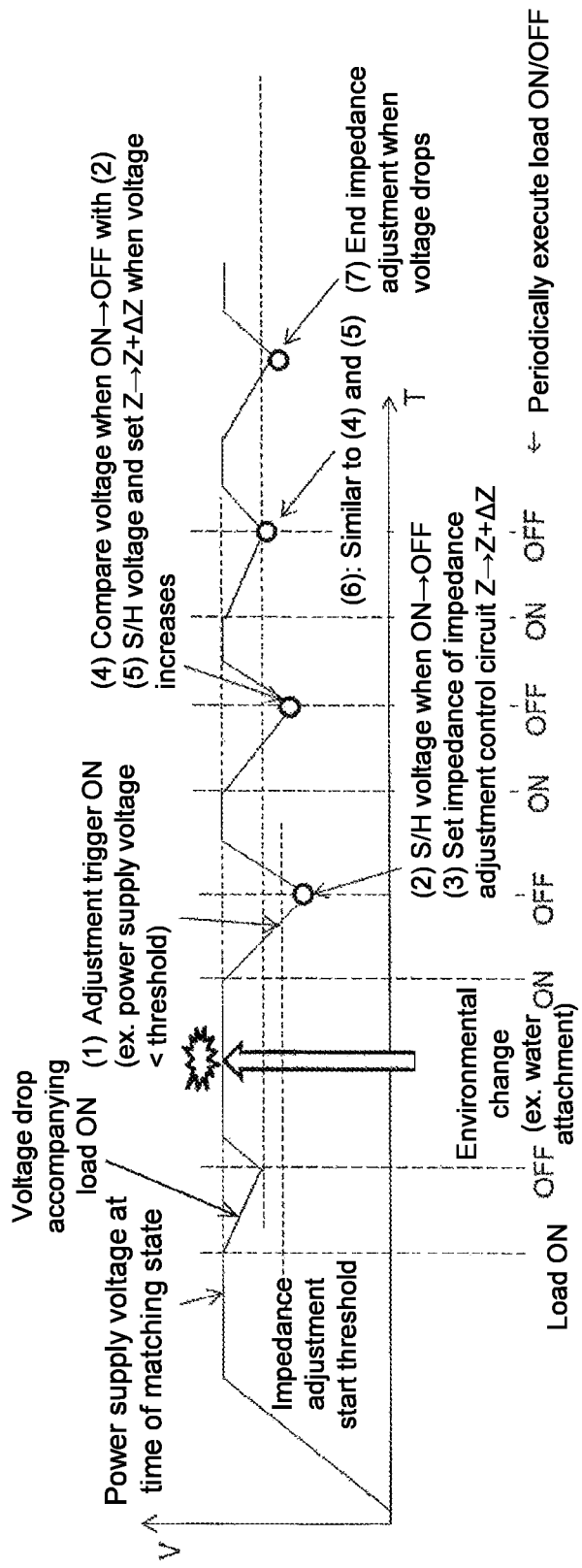
FIG. 10 is a diagram illustrating one example of variation in a power supply voltage output from a rectification circuit according to an embodiment.

FIG. 10 is a diagram illustrating one example of variations in a power supply voltage output from the rectification circuit 12 according to the embodiment. In FIG. 10, the vertical axis represents the voltage, and the horizontal axis represents the time as an example. In FIG. 10, a timing at which the load 30 is activated is represented as "load ON" or "ON", and a timing at which the operation of the load 30 is stopped is represented as "load OFF" or "OFF". That is, the load 30 according to the embodiment becomes "load ON" at a predetermined cycle and continues to be driven during a period from "load ON" to "load OFF". As illustrated in FIG. 10 as an example, when the load 30 is activated, the power supply voltage output by the rectification circuit 12 decreases in accordance with a voltage drop accompanying the activation of the load 30. When impedance mismatch between the antenna 20 and the RF tag circuit 10 occurs in accordance with attachment of water or the like to the RF tag circuit 10, the power supply voltage output from the rectification circuit 12 falls below a predetermined threshold which triggers the impedance adjustment due to the voltage drop accompanying the activation of the load 30. In (1), for example, when the power supply voltage is below a predetermined threshold (for example, the threshold 1 illustrated in FIG. 6), an adjustment trigger is transmitted from the adjustment trigger generating circuit 16 to the impedance adjustment control circuit 14. In accordance with the reception of the adjustment trigger, the impedance adjustment control circuit 14 starts adjustment of the impedance. The process of (1), for example, corresponds to the process of OP2 illustrated in FIG. 9. In (2), the load control circuit 13 stops the operation of the load 30, and the impedance adjustment control circuit 14 samples and holds the power supply voltage at a time point at which the load 30 transitions from a driven state to a stopped state. In (3), the impedance adjustment control circuit 14 increases the impedance of the matching circuit 11 by ΔZ. The processes of (2) and (3), for example, correspond to the process of OP4 illustrated in FIG. 9. In (4), the impedance adjustment control circuit 14 compares the power supply voltage at a time point at which the load 30 transitions from a driven state to a stopped state with the voltage that is sampled and held in (2). The process of (4), for example, corresponds to the process of OP8 illustrated in FIG. 9. In (5), since a rise in the power supply voltage is detected at the time point of (4), the impedance adjustment control circuit 14 increases the impedance of the matching circuit 11 by ΔZ. The process of (5), for example, corresponds to the process of OP4 from "Yes" in OP8 illustrated in FIG. 9. In (6), a process similar to (4) and (5) is executed. In (7), the impedance adjustment control circuit 14 detects a decrease in the power supply voltage at the time point of (7) from the time point of (6) and thus ends the impedance adjustment. The process of (7), for example, corresponds to the process of No in OP8 illustrated in FIG. 9.

Figure 11:
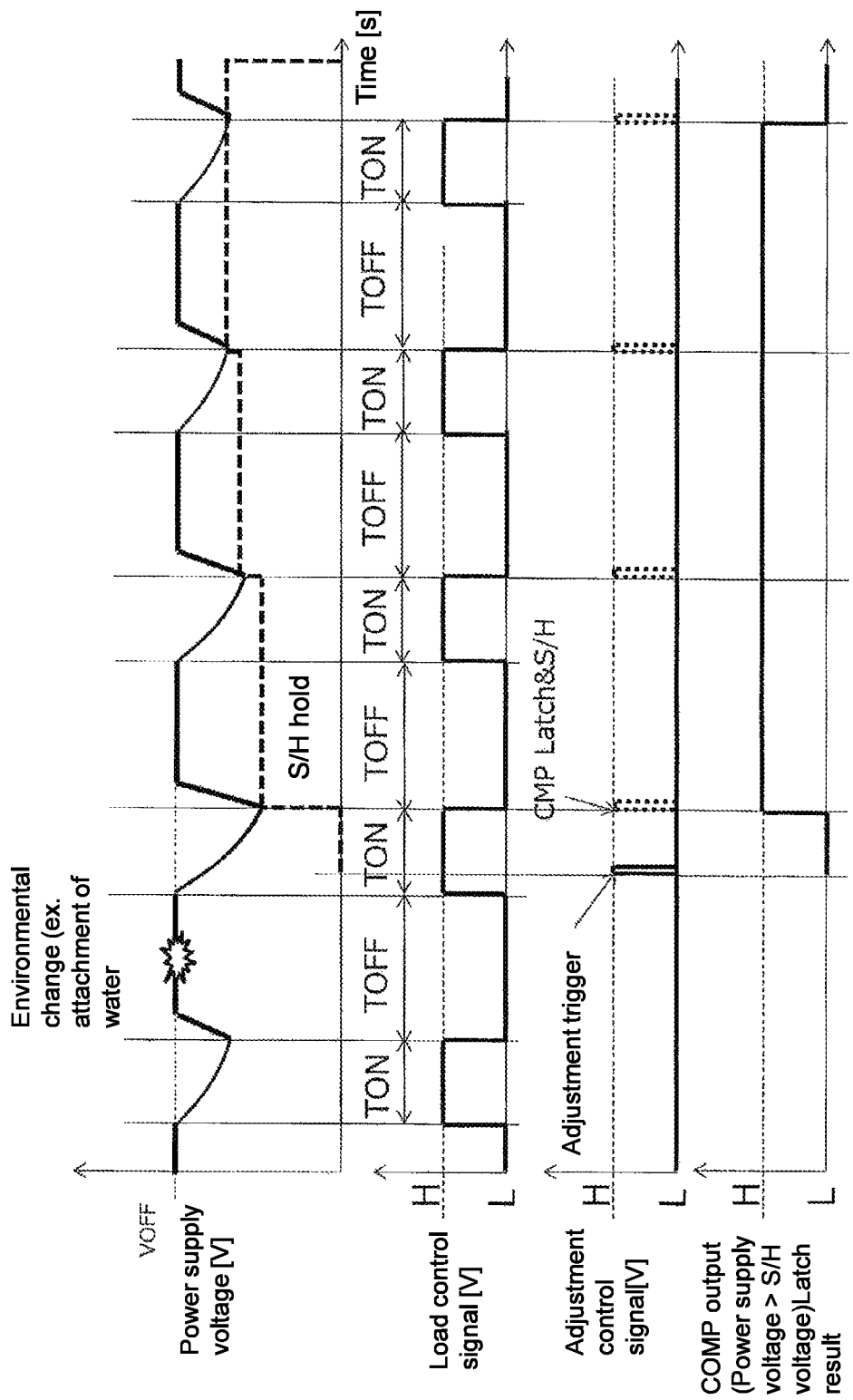
FIG. 11 is a diagram illustrating one example of waveforms of various signals transmitted in an embodiment.

FIG. 11 is a diagram illustrating one example of waveforms of various signals transmitted in the embodiment. In FIG. 11, a period of "TON" is an example of a period in which the load 30 is driven, and a period of "TOFF" is an example of a period in which the load 30 is not driven. In FIG. 11, the horizontal axis represents the time as an example. In FIG. 11, a first stage illustrates the fluctuation of a power supply voltage (solid line) and a voltage that is sampled and held (broken line), a second stage illustrates the fluctuation of a load control signal, a third stage illustrates the fluctuation of an adjustment control signal including an adjustment trigger (solid line) and sample/hold instructions (broken line), and a fourth stage illustrates comparison of the comparator 62 (denoted as COMP in the drawing) included in the impedance adjustment control circuit 14. In each of the first to fourth stages illustrated in FIG. 11, the vertical axis represents the voltage. When the capacitance of the variable-capacitance capacitor 53 when an adjustment trigger is input is not a lowest value of settable capacitance, the impedance adjustment control circuit 14 may initialize the capacitance of the variable-capacitance capacitor 53 to the lowest value of the capacitance settable in the variable-capacitance capacitor 53.

As illustrated in FIG. 11 as an example, the load 30 is driven while the load control signal is transmitted (in a period of TON) and is stopped while the load control signal is not transmitted (in a period of TOFF). When receiving the adjustment trigger, the impedance adjustment control circuit 14 starts the impedance adjustment. When a current power supply voltage is higher than the sampled and held power supply voltage, the output of the comparator 62 included in the impedance adjustment control circuit 14 becomes "H." When the output of the comparator 62 is "H," the impedance adjustment control circuit 14 increases the capacitance of the variable-capacitance capacitor 53 included in the matching circuit 11. As a result of the increase in the capacitance of the variable-capacitance capacitor 53, when the difference between the sampled and held power supply voltage and the current power supply voltage disappears, the output of the comparator 62 becomes "L," and the impedance adjustment ends.

<Operational Effect of the Embodiment>

In the embodiment, as described above, the load 30 repeats the driven state (for example, TON illustrated in FIG. 11), the stopped state (for example, TOFF illustrated in FIG. 11), the driven state, and the stopped state at a predetermined cycle. In each period in which the load 30 is activated, the power supply voltage that is sampled and held at a timing at which the load 30 transitions from the driven state to the stopped state is compared. For this reason, impedance adjustment can be performed without waiting until the power supply voltage is stabilized. As a result, according to the embodiment, even when the driving time of the load 30 is a time shorter than the time constant, the impedance adjustment can be performed.

According to the embodiment, when the impedance between the RF tag circuit 10 and the antenna 20 is mismatched, the adjustment trigger generating circuit 16 transmits an adjustment trigger. When receiving the adjustment trigger, the impedance adjustment control circuit 14 starts the impedance adjustment exemplified in FIG. 9. For this reason, according to the embodiment, when impedance mismatch occurs, the RF tag circuit 10 can execute adjustment of the impedance.

According to the embodiment, when the voltage generated by the rectification circuit 12 is less than the threshold 1 due to a voltage drop accompanying the activation of the load, in which the threshold 1 is, for example, a value acquired by taking the safety coefficient into account with respect to the lower limit value of the voltage enabling the load 30 to stably operate, the adjustment trigger generating circuit 16 transmits an adjustment trigger. For this reason, according to the embodiment, before the voltage generated by the rectification circuit 12 is insufficient for a stable operation of the load 30, impedance matching can be performed.

According to the embodiment, as described above, the adjustment trigger generating circuit 16, for example, may transmit an adjustment trigger when an execution result of the command for the load 30 received from the reader/writer device 40 using the load 30 through wireless communication via the antenna 20 is an error. When the execution result of the command for the load 30 is an error, a case may be considered in which electric power generated by the rectification circuit 12 decreases due to an influence of impedance mismatch between the antenna 20 and the RF tag circuit 10, and, as a result, the load 30 does not stably operate. For this reason, according to the embodiment, the RF tag circuit 10 can perform adjustment of the impedance when the load 30 does not stably operate.

According to the embodiment, as described above, the adjustment trigger generating circuit 16, for example, may transmit an adjustment trigger when receiving an instruction for impedance adjustment from the reader/writer device 40 using the load 30 through wireless communication via the antenna 20. The reader/writer device 40, for example, transmits an instruction for impedance adjustment when receiving an error in a response from the load 30, or when transmitting a command to the load 30, or the like. For this reason, according to the embodiment, the RF tag circuit 10 can execute adjustment of the impedance in accordance with an instruction from the reader/writer device 40 using the load 30.

<Modified Example>

According to the embodiment, at each cycle at which the load 30 is activated, the sampled and held power supply voltages are compared at a timing at which the load 30 transitions from the driven state to the stopped state. However, the timing at which the power supply voltage is sampled and held and compared is not limited to the timing at which the load 30 transitions from the driven state to the stopped state. The timing at which the power supply voltage is sampled and held and compared may be during the driving of the load 30 after a predetermined time has elapsed from the activation of the load 30. In the modified example, an RF tag circuit that samples and holds a power supply voltage and compares the same at a timing during the driving of the load 30 after a predetermined time elapses from the activation of the load 30 will be described. Hereinafter, the modified example will be described with reference to the drawings. The same reference sign will be assigned to the same component as that of the embodiment, and description thereof will be omitted.

Figure 12:
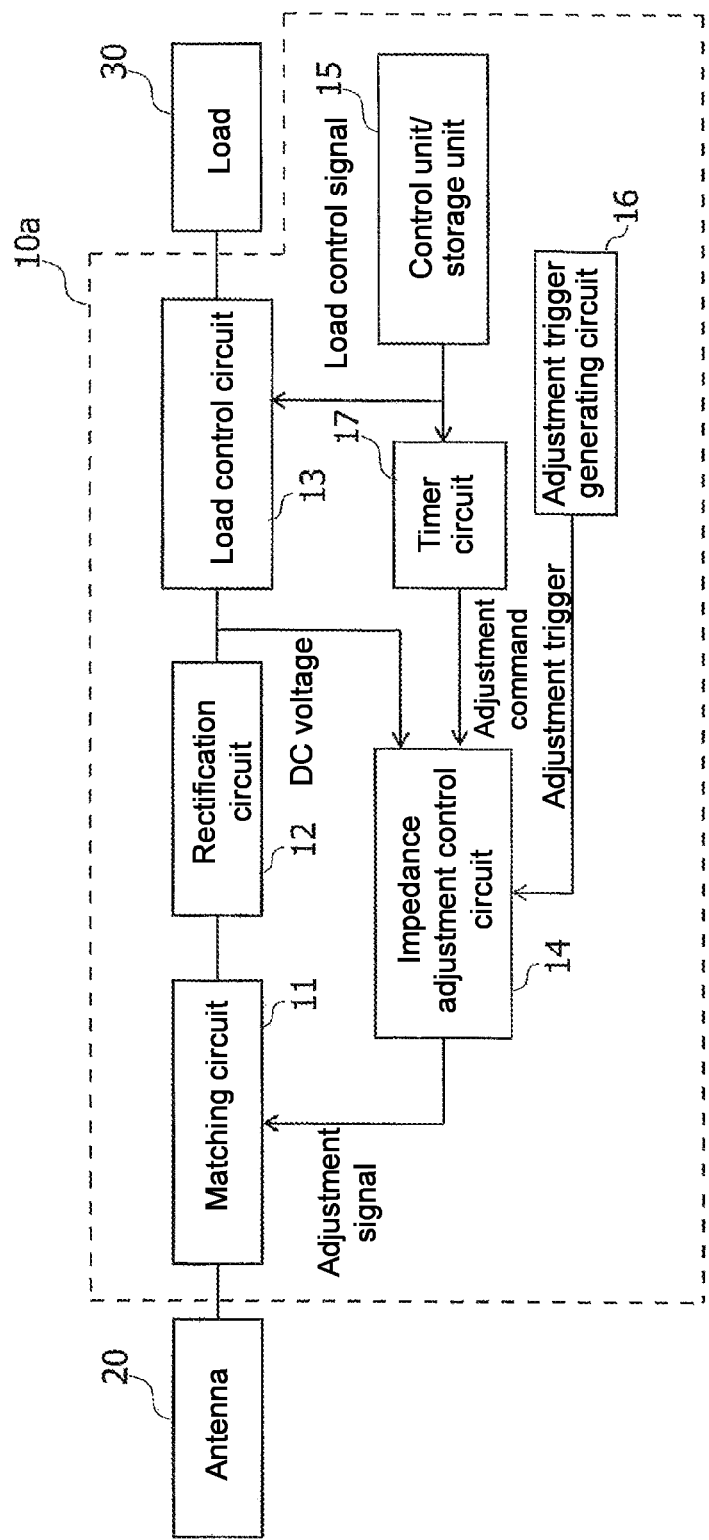
FIG. 12 is a diagram illustrating one example of the configuration of an RF tag circuit according to a modified example.

FIG. 12 is a diagram illustrating one example of the configuration of an RF tag circuit 10a according to the modified example. In FIG. 12, a reader/writer device 40 and a communication circuit 18 are not illustrated. The RF tag circuit 10a according to the modified example is different from the RF tag circuit 10 according to the embodiment in that a timer circuit 17 is added between the impedance adjustment control circuit 14 and the control part/storage part 15.

The timer circuit 17 counts an elapsed time after detection of the activation of the load 30 and outputs an adjustment instruction to the impedance adjustment control circuit 14 when a predetermined standby time elapses. The length of the predetermined standby time is equal to or less than the driving time of the load 30. That is, the timer circuit 17 transmits an adjustment command while the load 30 is driven. The timer circuit 17 can detect the activation of the load 30 by, for example, an input of a load control signal from the control part/storage part 15.

Figure 13:
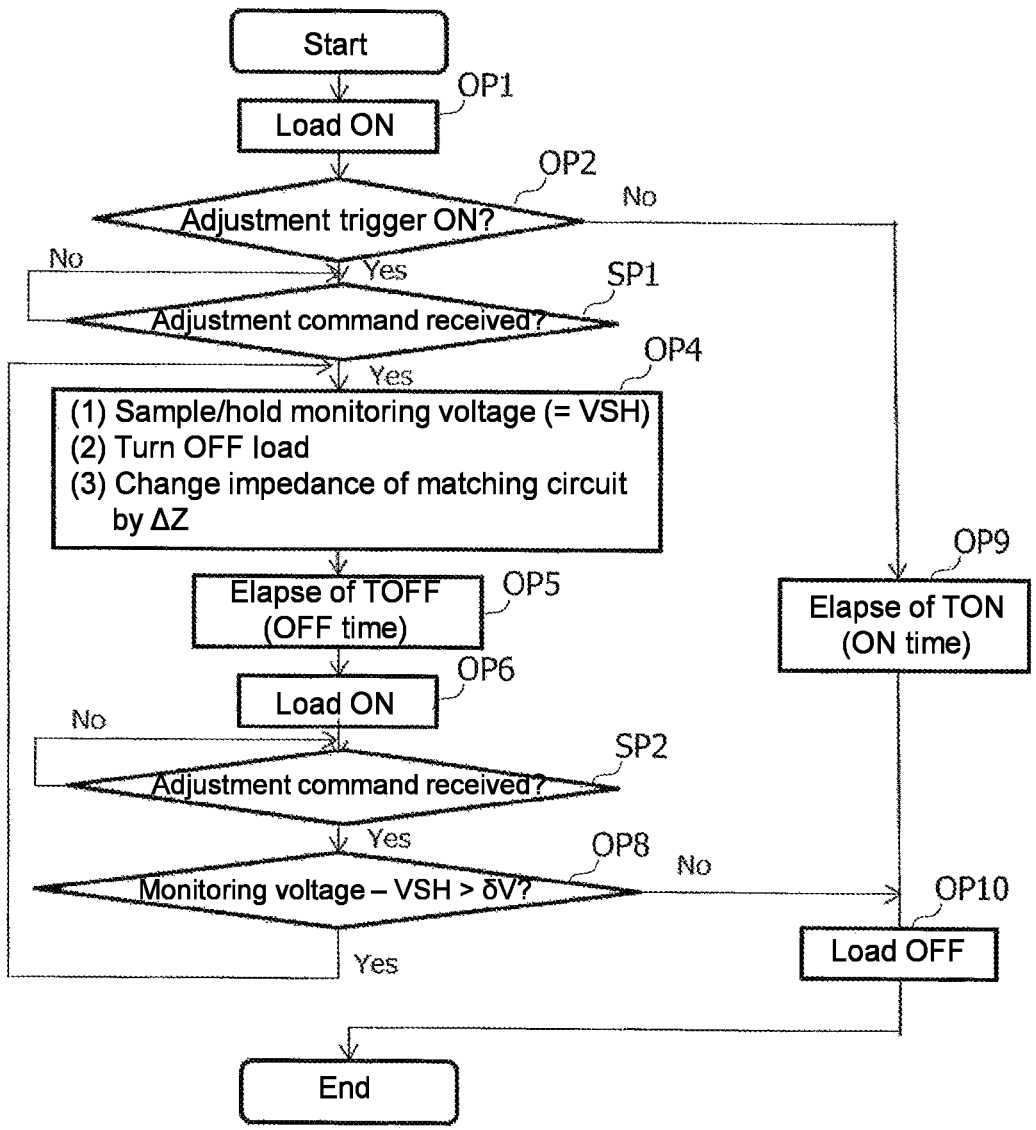
FIG. 13 is a diagram illustrating one example of a processing flow according to a modified example.

FIG. 13 is a diagram illustrating one example of a processing flow according to the modified example. The same reference sign will be assigned to the same process as that illustrated in FIG. 9, and description thereof will be omitted. Hereinafter, one example of the processing flow according to the modified example will be described with reference to FIG. 13.

In SP1, the impedance adjustment control circuit 14 determines whether or not an adjustment command is input from the timer circuit 17. As described above, when the predetermined standby time has elapsed after the activation of the load 30, the timer circuit 17 outputs an adjustment command to the impedance adjustment control circuit 14. When the adjustment command is input (Yes in SP1), the process proceeds to OP4. When the adjustment command is not input (No in SP1), the process of SP1 is repeated. The process of SP2 is the same as that of SP1 except that the process repeated in the case of "No" in SP2 is SP2, and thus, description thereof will not be presented.

Figure 14:
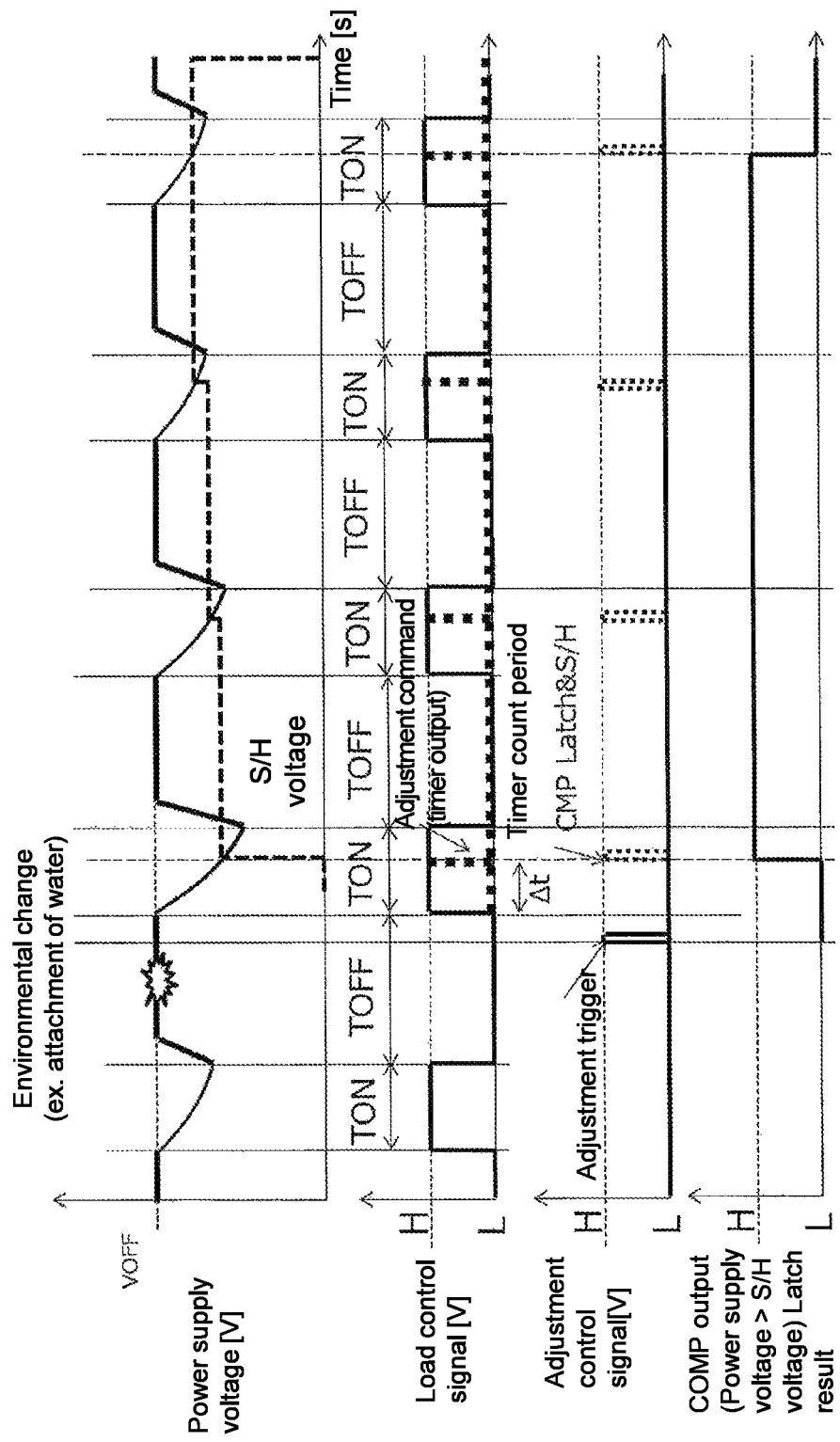
FIG. 14 is a diagram illustrating one example of waveforms of various signals transmitted in a modified example.

FIG. 14 is a diagram illustrating one example of waveforms of various signals transmitted in the modified example. The case of FIG. 14 is different from the case of FIG. 11 in that an adjustment command that is the output of the timer circuit 17 is added, and sample/hold is executed at a timing at which the adjustment command is transmitted. In FIG. 14, a predetermined standby time (a time until the adjustment trigger is transmitted after the activation of the load 30) counted by the timer circuit 17 is indicated as "Δt."

In the modified example, the adjustment command is transmitted after the predetermined standby time from the activation of the load 30. For this reason, according to the modified example, even when the cycle at which the load 30 is activated changes, a power supply voltage after elapse of a predetermined time from the activation of the load 30 can be used for comparison. Accordingly, according to the first modified example, even when there is a change in the cycle at which the load 30 is activated, appropriate impedance adjustment can be executed.

In the embodiment and the modified example described above, the adjustment trigger generating circuit 16 compares the voltage supplied from the rectification circuit 12 with the threshold 1 and the threshold 2. However, a comparison target of the adjustment trigger generating circuit 16 is not limited to the voltage supplied from the rectification circuit 12. For example, a current or electric power supplied from the rectification circuit 12 may be set as a comparison target of the adjustment trigger generating circuit 16.

In the embodiment and the modified example described above, the adjustment of the impedance is performed using a linear search of monotonously increasing the capacitance of the variable-capacitance capacitor 53 disposed inside the matching circuit 11. However, the algorithm of the adjustment of the impedance is not limited to the linear search of monotonously increasing the capacitance of the variable-capacitance capacitor 53. For example, the adjustment of the impedance may be performed using a linear search of monotonously decreasing the capacitance of the variable-capacitance capacitor 53. In addition, the adjustment of the impedance may be performed using an arbitrary search algorithm such as a binary search or a tree search.

In the embodiment and the modified example described above, for example, the adjustment of the impedance ends when a difference between the monitoring voltage and the power supply voltage that is sampled and held in OP4 illustrated in FIG. 9 is equal to or less than δV (No in OP8 illustrated in FIG. 9). However, a different criterion may be used for determination of the end of the adjustment of the impedance. For example, the adjustment of the impedance may end when a number of times of execution of the adjustment of the impedance reaches a predetermined number of times. In addition, the adjustment of the impedance may end when a time in which the adjustment of the impedance is executed reaches a predetermined time. Furthermore, the adjustment of the impedance may end when the value of the impedance of the matching circuit 11 that is increased through the adjustment of the impedance becomes a predetermined value (a maximum value or a minimum value).

The embodiment and the modified example described above may be combined together.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An RF tag circuit connected to an antenna and a load, the RF tag circuit comprising:
    a rectification circuit that rectifies a radio wave received by the antenna and supplies DC power;
    a matching circuit, of which an impedance is changeable, disposed between the antenna and the rectification circuit;
    a control part that repeatedly controls activation and stopping of the load; and
    an adjustment part that changes the impedance of the matching circuit in a predetermined direction and stores a first electric power generated by the rectification circuit when a predetermined time has elapsed after the load is activated and changes the impedance of the matching circuit based on a magnitude relationship between a second electric power generated by the rectification circuit when the predetermined time has elapsed after the load is activated at a timing after a time point at which the first electric power is generated and the stored first electric power.

2. The RF tag circuit according to claim 1, wherein the predetermined time is less than a time represented by a time constant of the load.

3. The RF tag circuit according to claim 1, further comprising:
    an instruction circuit that transmits an adjustment instruction instructing a start of impedance adjustment to the adjustment part in a case in which an impedance between the RF tag circuit and the antenna is mismatched,
    wherein the adjustment part starts a process when receiving the adjustment instruction from the instruction circuit.

4. The RF tag circuit according to claim 3, wherein the case in which the impedance between the RF tag circuit and the antenna is mismatched includes a case in which a voltage generated by the rectification circuit is less than a predetermined threshold due to a voltage drop accompanying the activation of the load.

5. The RF tag circuit according to claim 3, wherein the case in which the impedance between the RF tag circuit and the antenna is mismatched includes a case in which an execution result of a command for the load received from a device using the load through wireless communication via the antenna is an error.

6. The RF tag circuit according to claim 3, wherein the case in which the impedance between the RF tag circuit and the antenna is mismatched includes a case in which an instruction for impedance adjustment is received from a device using the load through wireless communication via the antenna.

7. The RF tag circuit according to claim 1, wherein the control part activates the load at a predetermined cycle.

8. The RF tag circuit according to claim 2, further comprising:
    an instruction circuit that transmits an adjustment instruction instructing a start of impedance adjustment to the adjustment part in a case in which an impedance between the RF tag circuit and the antenna is mismatched,
    wherein the adjustment part starts a process when receiving the adjustment instruction from the instruction circuit.

9. The RF tag circuit according to claim 8, wherein the case in which the impedance between the RF tag circuit and the antenna is mismatched includes a case in which a voltage generated by the rectification circuit is less than a predetermined threshold due to a voltage drop accompanying the activation of the load.

10. The RF tag circuit according to claim 4, wherein the case in which the impedance between the RF tag circuit and the antenna is mismatched includes a case in which an execution result of a command for the load received from a device using the load through wireless communication via the antenna is an error.

11. The RF tag circuit according to claim 4, wherein the case in which the impedance between the RF tag circuit and the antenna is mismatched includes a case in which an instruction for impedance adjustment is received from a device using the load through wireless communication via the antenna.

12. The RF tag circuit according to claim 5, wherein the case in which the impedance between the RF tag circuit and the antenna is mismatched includes a case in which an instruction for impedance adjustment is received from a device using the load through wireless communication via the antenna.

13. The RF tag circuit according to claim 2, wherein the control part activates the load at a predetermined cycle.

14. The RF tag circuit according to claim 3, wherein the control part activates the load at a predetermined cycle.

15. The RF tag circuit according to claim 4, wherein the control part activates the load at a predetermined cycle.

\* \* \* \* \*